United States Patent
Ebuchi et al.

(10) Patent No.: US 7,986,175 B2
(45) Date of Patent: Jul. 26, 2011

(54) SPREAD SPECTRUM CONTROL PLL CIRCUIT AND ITS START-UP METHOD

(75) Inventors: Tsuyoshi Ebuchi, Osaka (JP); Yoshihide Komatsu, Osaka (JP); Michiyo Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/595,008

(22) PCT Filed: Mar. 18, 2008

(86) PCT No.: PCT/JP2008/000639
§ 371 (c)(1),
(2), (4) Date: Oct. 7, 2009

(87) PCT Pub. No.: WO2008/146433
PCT Pub. Date: Dec. 4, 2008

(65) Prior Publication Data
US 2010/0127739 A1    May 27, 2010

(30) Foreign Application Priority Data

May 30, 2007 (JP) ................................ 2007-143261
Nov. 13, 2007 (JP) ................................ 2007-294371

(51) Int. Cl.
*H03L 7/06* (2006.01)

(52) U.S. Cl. ......... 327/147; 327/151; 327/156; 327/160

(58) Field of Classification Search .................. 327/141, 327/144–163; 331/1 A, 15–17; 375/373–376
See application file for complete search history.

(56) References Cited

U.S. PATENT DOCUMENTS

| | | | | |
|---|---|---|---|---|
| 6,980,581 | B1* | 12/2005 | Sha et al. ....................... | 375/130 |
| 7,315,218 | B1* | 1/2008 | Fernandez ....................... | 331/44 |
| 2002/0075080 | A1* | 6/2002 | Nelson et al. .................... | 331/11 |
| 2003/0042985 | A1* | 3/2003 | Shibahara et al. ............... | 331/17 |
| 2005/0258906 | A1* | 11/2005 | Su et al. .......................... | 331/10 |
| 2006/0139105 | A1* | 6/2006 | Maxim et al. .................... | 331/16 |
| 2006/0139106 | A1 | 6/2006 | Dosho et al. | |
| 2006/0176933 | A1 | 8/2006 | Uemura et al. | |
| 2006/0226916 | A1* | 10/2006 | Florescu et al. ................. | 331/16 |
| 2007/0030079 | A1* | 2/2007 | Kawamoto et al. ............. | 331/16 |
| 2008/0218277 | A1* | 9/2008 | Tan et al. ........................ | 331/17 |

FOREIGN PATENT DOCUMENTS

| JP | 2006-180428 | 7/2006 |
|---|---|---|
| JP | 2006-197308 | 7/2006 |
| JP | 2007-049277 | 2/2007 |

OTHER PUBLICATIONS

Japanese Notice of Reasons for Rejection, w/ English translation thereof, issued in Japanese Patent Application No. JP 2009-516160 dated Jun. 29, 2010.

* cited by examiner

*Primary Examiner* — Lincoln Donovan
*Assistant Examiner* — Brandon S Cole
(74) *Attorney, Agent, or Firm* — McDermott Will & Emery LLP (57) ABSTRACT

A calibration circuit (19) adjusts at least one of one of a charging current of a charge pump circuit (12) and a capacitance value of a filter capacitor in a loop filter circuit (13) and a gain of a voltage controlled oscillator (14), depending on a frequency of a reference clock signal input to a calibration circuit (10).

14 Claims, 10 Drawing Sheets

SPREAD SPECTRUM CONTROL PLL CIRCUIT AND ITS START-UP METHOD

RELATED APPLICATIONS

This application is the U.S. National Phase under 35 U.S.C. §371 of International Application No. PCT/JP2008/000639, filed on Mar. 18, 2008, which in turn claims the benefit of Japanese Application No. 2007-143261, filed on May 30, 2007 and Japanese Application No. 2007-294371, filed Nov. 13, 2007 the disclosures of which Applications are incorporated by reference herein.

TECHNICAL FIELD

The present invention relates to a device which generates a spread spectrum clock signal, and more particularly, to a spread spectrum control PLL circuit (hereinafter referred to as an SSC-PLL (Spread Spectrum Control Phase Locked Loop)).

BACKGROUND ART

In recent years, as the speed of SoCs (Systems on Chip) has been increased, problematic electromagnetic radiation (EMI: Electromagnetic Interference) has become significant in LSIs (Large Scale Integrations) or digital household electrical appliances. The SSC-PLL is a technique by which small modulation is performed with respect to the frequency (input frequency) of a reference clock signal in an LSI to spread the spectrum of an output clock signal, thereby reducing the peak value of EMI. The SSC-PLL can be implemented with low cost, and in addition, has a high peak value reducing effect, and therefore, is considered as a promising solution to the EMI problem. As a spread spectrum modulation technique, a triangular wave modulation technique, which has a high peak reducing effect, is often used. A spread spectrum modulation frequency is typically several tens of KHz.

On the other hand, in the field of high-speed interfaces, such as an in-car IF (Interface), LVDS (Low Voltage Differential Signaling), and HDMI (High-Definition Multimedia Interface), as the functionality and performance of digital household electrical appliances have been increased, the operating frequency has had a wider range. For example, as an input frequency, the in-car IF requires 13.5 MHz to 81 MHz, LVDS requires 20 MHz to 160 MHz, and HDMI requires 27 MHz to 225 MHz. Therefore, the SSC-PLL needs to support a wide range of frequencies.

Figure 15:
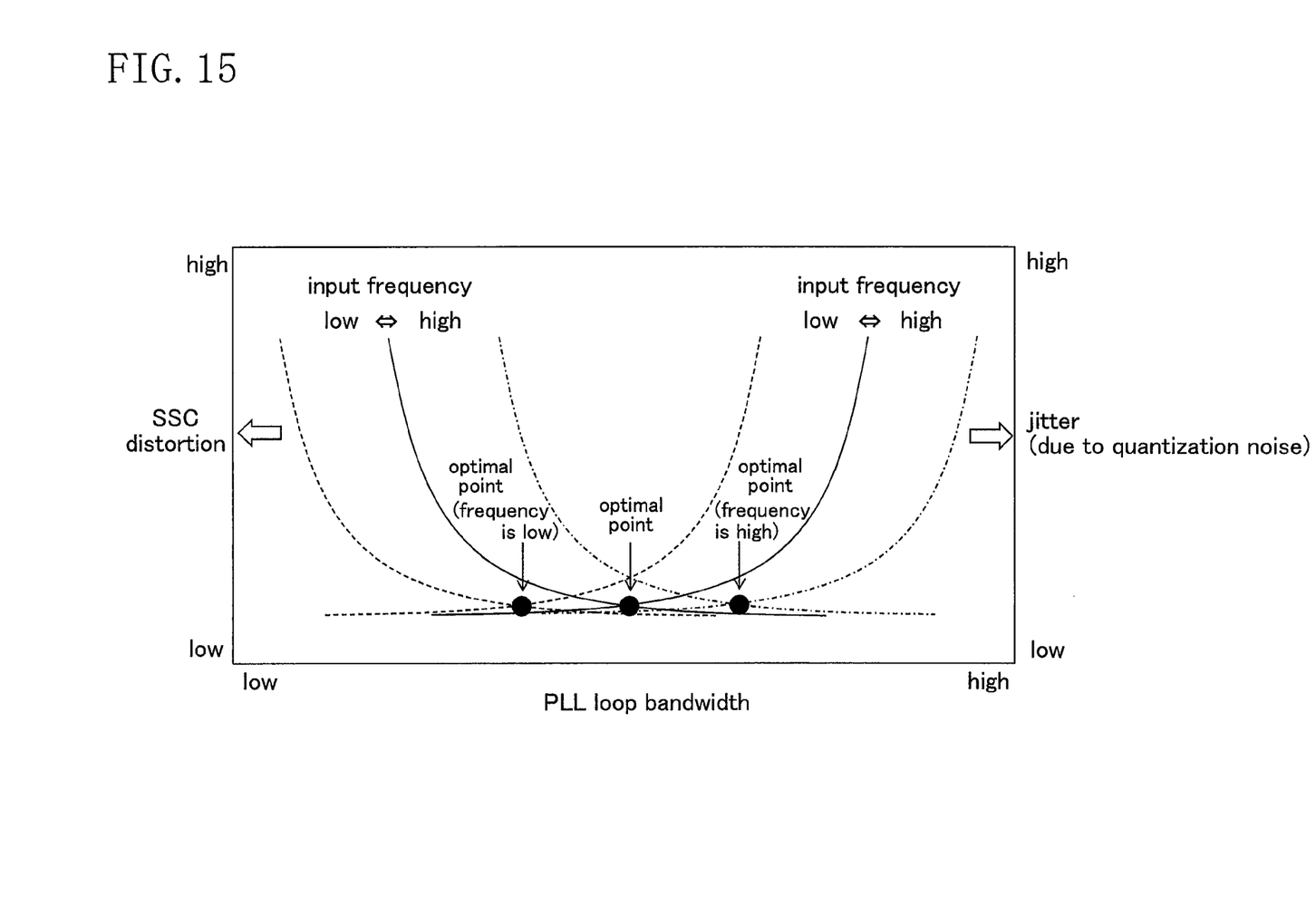
FIG. 15 is a graph showing a relationship between each of output distortion and output jitter of an SSC-PLL and a loop bandwidth.

Referring to FIG. 15, in the SSC-PLL, output jitter caused by quantization noise increases with an increase in loop bandwidth. On the other hand, output distortion caused by spread spectrum modulation increases with a decrease in loop bandwidth. As the output distortion becomes larger, the EMI peak value reducing effect becomes smaller. Therefore, in the SSC-PLL, it is desirable to fix the loop bandwidth to an optimal value which reduces both the jitter and the distortion (an optimal point shown in FIG. 15). However, since characteristics of the jitter and the distortion vary depending on the input frequency, the optimal value of the loop bandwidth also varies (see FIG. 15). Therefore, if the loop bandwidth is fixed, then when the input frequency varies over a wide range, the jitter or the distortion is likely to increase.

To solve this problem, there is a technique in which the loop bandwidth is set to an optimal value by nonlinearly changing the gain of a VCO (Voltage Controlled Oscillator) included in the SSC-PLL which would otherwise linearly change with respect to a control voltage, to follow a change in the input frequency (see, for example, Patent Document 1).
Patent Document 1: U.S. Pat. No. 6,980,581

DISCLOSURE OF THE INVENTION

Problems to be Solved by the Invention

However, if an analog circuit is used to construct a VCO having a nonlinear gain, it is necessary to employ a resistor, resulting in an increase in circuit area. Moreover, it is considerably difficult to design such a VCO, and the number of design steps increases. Therefore, such a VCO is not very suitable for SoCs for which low cost and a low area are strictly demanded. Moreover, variations in process cause variations in VCO gain, which also leads to variations in loop bandwidth of the SSC-PLL. Therefore, the conventional technique is not very suitable for a microprocess having large variations in process.

In view of the aforementioned problems, an object of the present invention is to provide a spread spectrum control PLL circuit including a VCO having a simple configuration, whose loop bandwidth preferably varies depending on an input frequency which varies over a wide range, and which absorbs variations in process to provide a predetermined loop bandwidth with respect to a predetermined input frequency.

Solution To The Problems

To achieve the object, the present invention provides a spread spectrum control PLL circuit for outputting a spread spectrum clock signal based on an input reference clock signal, including a charge pump circuit configured to switch charging and discharging of a charging current, depending on a phase difference between a feedback clock signal based on an output clock signal of the PLL circuit and the reference clock signal, a loop filter circuit having a filter capacitor which is charged and discharged using the charging current output from the charge pump circuit, a voltage controlled oscillator configured to oscillate at a frequency depending on an input control voltage, and a calibration circuit configured to adjust at least one of one of the charging current of the charge pump circuit and a capacitance value of the filter capacitor and a gain of the voltage controlled oscillator, depending on a frequency of the reference clock signal. As a result, by the calibration circuit adjusting at least one of one of the charging current of the SSC-PLL and the filter capacitance value and the VCO gain, variations in process can be absorbed. Moreover, the adjustment is performed, depending on the frequency of the reference clock signal, whereby the loop bandwidth can be preferably changed, depending on an input frequency which varies over a wide range.

Specifically, the voltage controlled oscillator includes a VI conversion circuit configured to generate a current depending on the control voltage, and a ring oscillator configured to oscillate at a frequency depending on the generated current. The calibration circuit adjusts a voltage-current conversion gain of the VI conversion circuit. Thus, a linear-gain VCO which does not require a resistor and is therefore easy to design can be used.

Also, specifically, the voltage controlled oscillator includes a selector circuit configured to select as the control voltage one from a first voltage, a second voltage, and an output voltage of the loop filter circuit. The calibration circuit includes a timer circuit configured to measure a period of time depending on the frequency of the reference clock signal, a counter circuit configured to count pulses of the output clock signal of the PLL circuit or a frequency-divided clock signal thereof during a period of time when the timer circuit is operating, and a control circuit configured to control the selector circuit to adjust the gain of the voltage controlled oscillator so that a difference in count value of the counter circuit between when the first voltage is input to the voltage controlled oscillator and when the second voltage is input to the voltage controlled oscillator approaches a target value. More specifically, the calibration circuit includes a first memory circuit and a second memory circuit configured to store the count value of the counter circuit which is obtained when the first voltage is input to the voltage controlled oscillator and when the second voltage is input to the voltage controlled oscillator, respectively, a subtractor configured to calculate a difference between the count values stored in the first and second memory circuits, and a comparator configured to compare an output of the subtractor with the target value. The control circuit adjusts the gain of the voltage controlled oscillator based on an output of the comparator. Even more specifically, the calibration circuit outputs a digital control signal to switch the gain of the voltage controlled oscillator. The comparator outputs, as a result of the comparison, 1-bit information indicating whether or not the output of the subtractor is larger than the target value. The control circuit determines a value of the digital control signal by binary search based on the result of the comparison by the comparator.

Also, specifically, the calibration circuit includes an oscillator configured to have a replica charge pump circuit which is a replica of the charge pump circuit and a second filter capacitor which is charged and discharged using a charging current output from the replica charge pump circuit, and oscillate at a frequency depending on the charging current of the replica charge pump circuit and a capacitance value of the second filter capacitor, a timer circuit configured to measure a period of time depending on the frequency of the reference clock signal, a counter circuit configured to count pulses of an output clock signal of the oscillator or a frequency-divided clock signal thereof during a period of time when the timer circuit is operating, and a control circuit configured to adjust the charging current of the replica charge pump circuit so that a count value of the counter circuit approaches a target value. The control circuit uses a common control signal to set the charging current for each of the charge pump circuit and the replica charge pump circuit. More specifically, the calibration circuit includes a comparator configured to compare the count value of the counter circuit with the target value. The control circuit adjusts the charging current of the replica charge pump circuit based on an output of the comparator. Even more specifically, the calibration circuit outputs a digital control signal to switch the charging current. The comparator outputs, as a result of the comparison, 1-bit information indicating whether or not the count value of the counter circuit is larger than the target value. The control circuit determines a value of the digital control signal by binary search based on the result of the comparison by the comparator.

Also, specifically, the calibration circuit includes an oscillator configured to have a second charge pump circuit, and a replica filter capacitor which is a replica of the filter capacitor and is charged and discharged using a charging current output from the second charge pump circuit, and oscillate at a frequency depending on the charging current of the second charge pump circuit and a capacitance value of the replica filter capacitor, a timer circuit configured to measure a period of time depending on the frequency of the reference clock signal, a counter circuit configured to count pulses of an output clock signal of the oscillator or a frequency-divided clock signal thereof during a period of time when the timer circuit is operating, and a control circuit configured to adjust the capacitance value of the replica filter capacitor so that a count value of the counter circuit approaches a target value. The control circuit uses a common control signal to set the capacitance values of the filter capacitor and the replica filter capacitor. More specifically, the calibration circuit includes a comparator configured to compare the count value of the counter circuit with the target value. The control circuit adjusts the capacitance value of the replica filter capacitor based on an output of the comparator. Even more specifically, the calibration circuit outputs a digital control signal to switch the capacitance value of the filter capacitor. The comparator outputs, as a result of the comparison, 1-bit information indicating whether or not the count value of the counter circuit is larger than the target value. The control circuit determines a value of the digital control signal by binary search based on the result of the comparison by the comparator.

Also, each of the timer circuits counts pulses of the reference clock signal or a frequency-divided clock signal thereof to a predetermined number. Preferably, at least one of the predetermined number, the first voltage, the second voltage and the target value is variable. Thus, by setting at least one of these parameters to be variable, a relationship between the input frequency and the loop bandwidth can be appropriately switched, depending on the application.

Effect of the Invention

As described above, according to the present invention, a spread spectrum control PLL circuit which employs a VCO having a simple configuration can generate a clock signal whose jitter and distortion are both suppressed even if an input frequency varies over a wide range. Moreover, variations in process are absorbed, and therefore, the loop bandwidth can be controlled with high precision. As a result, requirements of SoCs can be satisfied and a yield in a microprocess can be improved.

DESCRIPTION OF THE REFERENCE CHARACTERS 10 spread spectrum control PLL circuit
12 charge pump circuit
13 loop filter circuit
131 filter capacitor
14 voltage controlled oscillator
142 VI conversion circuit
141 ring oscillator
144 selector circuit
19 calibration circuit
1911 timer circuit
1912 counter circuit
1913 memory circuit (first memory circuit)
1914 memory circuit (second memory circuit)
1915 subtractor
1916 comparator
1917 control circuit
1921 oscillator
1922 replica charge pump circuit
1923 filter capacitor (second filter capacitor)
1924 timer circuit
1925 counter circuit
1926 comparator
1927 control circuit
1922' charge pump circuit (second charge pump circuit)
1923' replica filter capacitor

BEST MODE FOR CARRYING OUT THE INVENTION

Hereinafter, the best mode for carrying out the present invention will be described with reference to the accompanying drawings.

(Embodiment of Spread Spectrum Control PLL Circuit)

Figure 1:
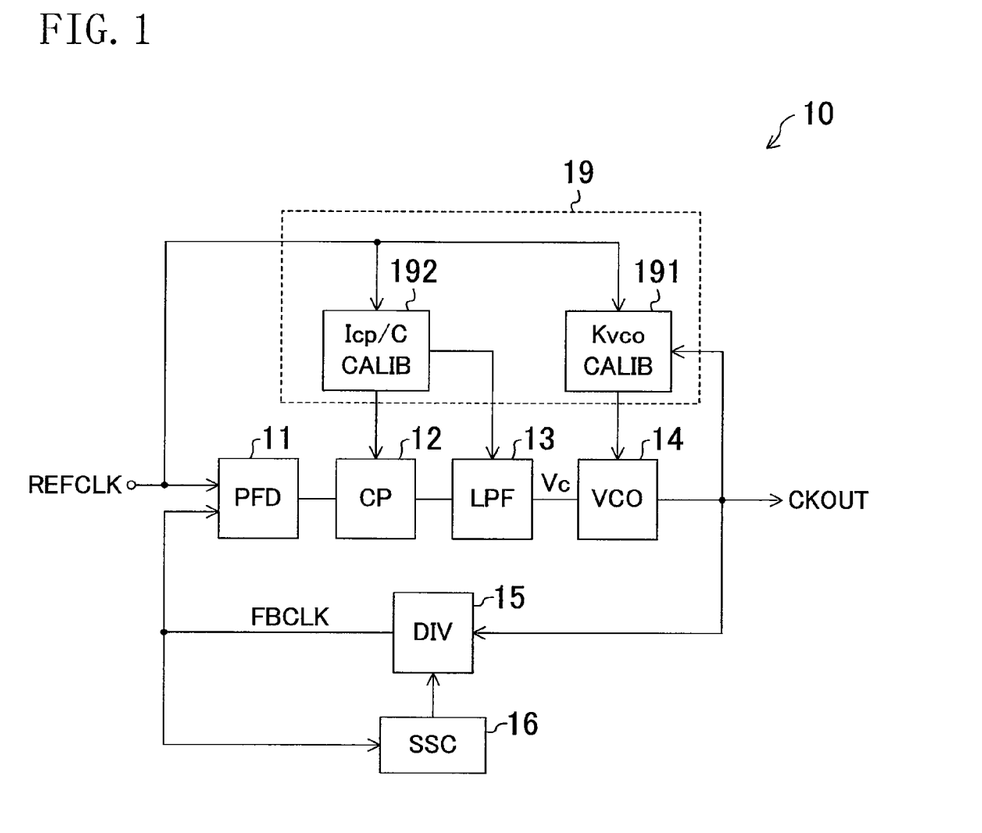
FIG. 1 is a diagram showing a configuration of an SSC-PLL according to an embodiment of the present invention.

FIG. 1 shows a configuration of an SSC-PLL according to an embodiment of the present invention. In the SSC-PLL 10, a phase frequency detector (PFD) 11 outputs a signal depending on a phase difference between a reference clock signal REFCLK and a feedback clock signal FBCLK. A charge pump circuit (CP) 12 switches between charging and discharging of a charging current in accordance with an output of the PFD 11. A loop filter circuit (LPF) 13 smoothes a charging current to generate a voltage Vc. A voltage controlled oscillator (VCO) 14 oscillates at a frequency depending on the voltage Vc, and outputs a clock signal CKOUT. A frequency divider (DIV) 15 divides a frequency of the clock signal CKOUT to generate the clock signal FBCLK. More specifically, the DIV 15 switches division ratios every predetermined period of time in accordance with a pattern generated by a spread spectrum modulation control circuit (SSC) 16, thereby averagely achieving frequency modulation. The SSC 16 generates a random pattern for switching the division ratios of the DIV 15 based on the clock signal FBCLK. As the SSC 16, a second- to fourth-order ΔΣ modulation circuit is typically used.

A loop bandwidth ωn of the SSC-PLL 10 is approximately represented by the following approximate expression:

$$\omega n = \sqrt{(Kvco/2\pi N \times Icp/C)} \quad (1)$$

where Icp indicates a charging current of the CP 12, C indicates a capacitance value of a filter capacitor (not shown) in the LPF 13, Kvco indicates a gain of the VCO 14, and N indicates a division ratio of the DIV 15. A calibration circuit 19 includes a circuit portion 191 which adjusts Kvco, depending on a frequency (input frequency fref) of the reference clock signal REFCLK, and a circuit portion 192 which adjusts Icp/C, depending on the input frequency fref. As a result, the loop bandwidth of the SSC-PLL 10 can be adaptively changed. Hereinafter, a configuration and operation of each of the CP 12, the LPF 13, the VCO 14 and the calibration circuit 19 will be described.

(Example Configuration of Voltage Controlled Oscillator)

Figure 2:
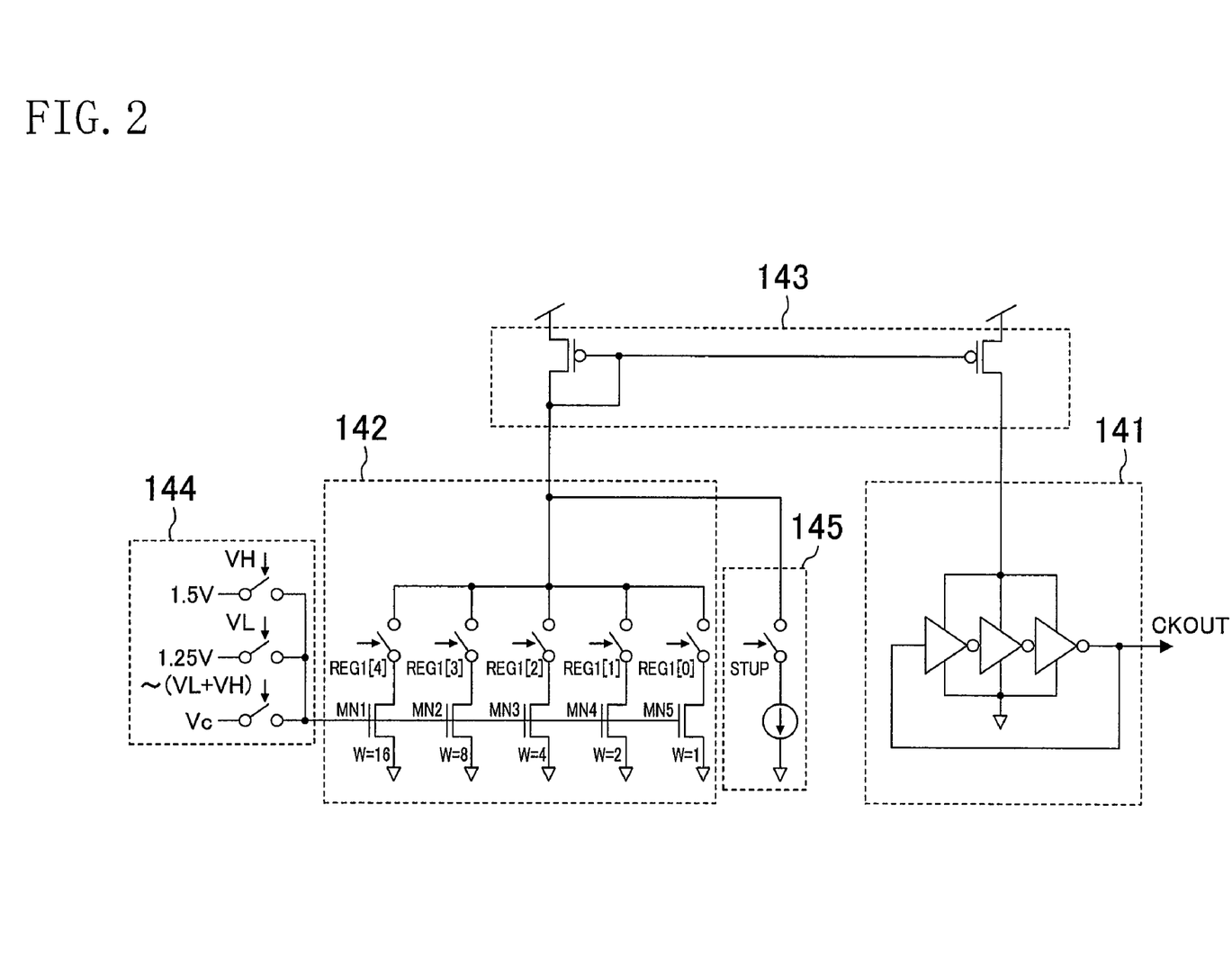
FIG. 2 is a diagram showing a configuration of a VCO.

FIG. 2 shows an example circuit configuration of the VCO 14. A ring oscillator 141 oscillates at a frequency depending on an input bias current Ibias to output the clock signal CKOUT. A VI conversion circuit 142 generates the bias current Ibias. The bias current Ibias is output from a current mirror circuit 143. Five N-channel transistors MN1 to MN5 having different sizes, and switches in which switching is controlled based on the respective bits of a 5-bit control signal REG1[4:0] which is output from the circuit portion 191 of the calibration circuit 19, are connected to the input side of the current mirror circuit 143. A common voltage is applied to the gates of the transistors MN1 to MN5. Also, if the size of the transistor MN5 is assumed to be 1 (W=1), the size of the transistor MN4 is 2 (W=2), the size of the transistor MN3 is 4 (W=4), the size of the transistor MN2 is 8 (W=8), and the size of the transistor MN1 is 16 (W=16). As a result, a voltage-current conversion gain of the VI conversion circuit 142 can be switched between 32 (=$2^5$) levels. In other words, the gain of the VCO 14 can be switched between 32 levels.

Figure 3:
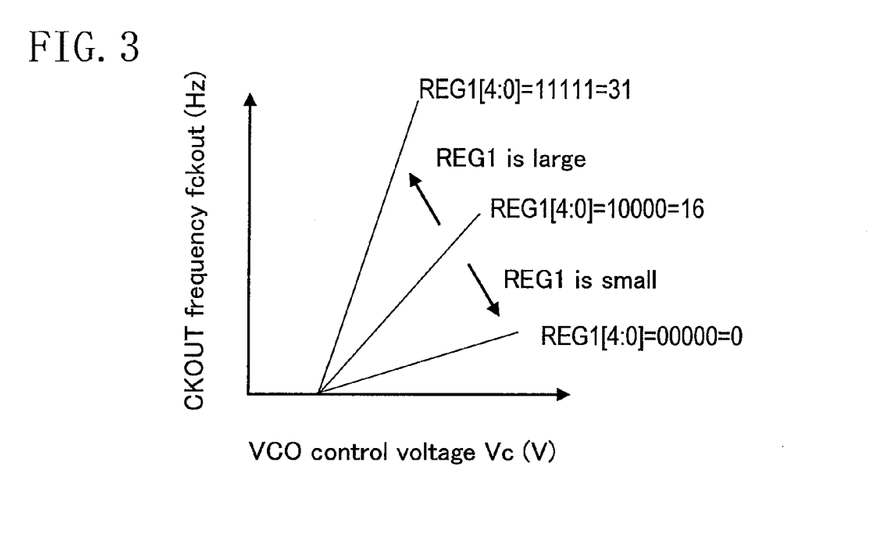
FIG. 3 is a graph showing changes in a gain of the VCO with respect to changes in a control signal.

FIG. 3 shows changes in the gain of the VCO 14 with respect to changes in the control signal REG1. As the value of the control signal REG1 is increased, the gain increases. As the value of the control signal REG1 is decreased, the gain decreases. Thus, the gain of the VCO 14 is substantially proportional to the value of the control signal REG1.

Referring back to FIG. 2, a selector circuit 144 selects one of an H voltage (e.g., 1.5 V), an L voltage (e.g., 1.25 V), and the voltage Vc output from the loop filter circuit 13 in accordance with control signals VH and VL output from the calibration circuit 19, and supplies the selected one to the gates of the transistors MN1 to MN5. Specifically, when the signal VH is active, the H voltage is selected and supplied. When the signal VL is active, the L voltage is selected and supplied. When both of the signals VH and VL are inactive, the voltage Vc is selected and supplied. The H and L voltages are generated by a voltage generating circuit (not shown) inside or outside the VCO 14. Note that the voltage Vc is input to the VCO 14 during normal operation of the SSC-PLL 10, so that the VCO 14 oscillates at a frequency which is substantially proportional to the voltage Vc.

A start-up circuit 145 includes a switch in which switching is controlled in accordance with a signal STUP, and a current source connected thereto. The start-up circuit 145 passes an offset current to the current mirror circuit 143 during a period of a start-up sequence described below so as to prevent the SSC-PLL 10 from falling into a deadlock state during start-up.

Note that the number of bits of the control signal REG1 may be other than five. As the number of bits is increased, the precision of the gain setting of the VCO 14 increases. Moreover, the VI conversion circuit 142 may include a P-channel transistor, and the current mirror circuit 143 may include an N-channel transistor. Alternatively, the VI conversion circuit 142 may include a P-channel transistor, and the current mirror circuit 143 may include both an N-channel transistor and a P-channel transistor.

(Example Configuration 1 of Calibration Circuit)

Figure 4:
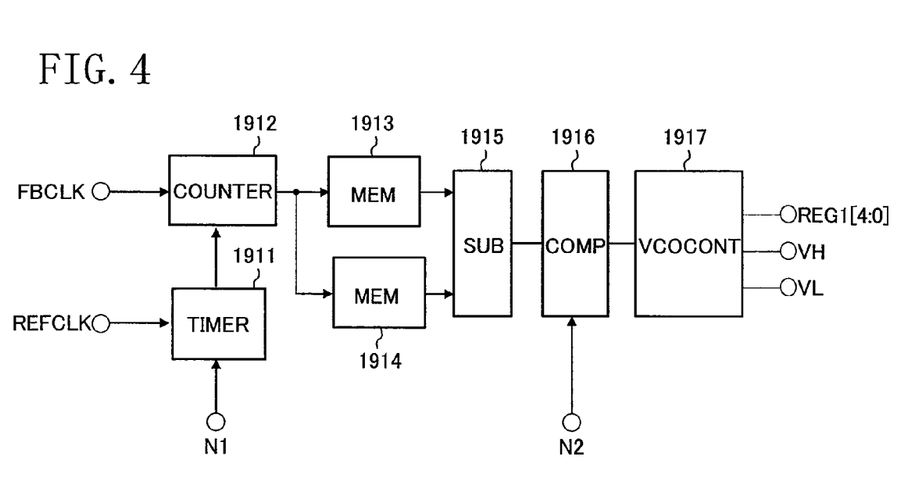
FIG. 4 is a diagram showing a configuration of a circuit portion of a calibration circuit which adjusts the gain of the VCO.

FIG. 4 shows an example configuration of the circuit portion 191 of the calibration circuit 19. A timer circuit 1911 measures a period of time depending on the frequency of the reference clock signal REFCLK. Specifically, the timer circuit 1911 counts pulses of the reference clock signal REFCLK to a predetermined number N1. Thus, by setting the number of pulses to be counted to a fixed value, the timer circuit 1911 measures a short period of time when the input frequency is high, and a long period of time when the input frequency is low. In other words, the timer circuit 1911 measures a period of time which is proportional to the input frequency. A counter circuit 1912 counts pulses of the feedback clock signal FBCLK during a period of time when the timer circuit 1911 is operating. A memory circuit 1913 stores a count value of the counter circuit 1912 which is obtained when the H voltage is input as the control voltage of the VCO 14. The memory circuit 1914 stores a count value of the counter circuit 1912 which is obtained when the L voltage is input as the control voltage of the VCO 14. A subtractor 1915 calculates a difference between the count values stored in the memory circuits 1913 and 1914. A comparator 1916 compares an output of the subtractor 1915 with a target value N2. Moreover, a control circuit 1917 outputs the control signal REG1 based on an output of the comparator 1916 to adjust the gain of the VCO 14. The control circuit 1917 also outputs the control signals VH and VL to control the selector circuit 144.

Note that, instead of the reference clock signal REFCLK, a clock signal obtained by dividing the frequency of the reference clock signal REFCLK may be input to the timer circuit 1911. Similarly, instead of the feedback clock signal FBCLK, the output clock signal CKOUT of the SSC-PLL 10 or a clock signal obtained by dividing the frequency of the clock signal CKOUT may be input to the counter circuit 1912. The aforementioned configurations are only for illustrative purposes. The control circuit 1917 may control the selector circuit 144 to adjust the gain of the VCO 14 so that a difference in the count value of the counter circuit 1912 between when the H voltage is input to the VCO 14 and when the L voltage is input to the VCO 14 approaches the target value N2.

Figure 5:
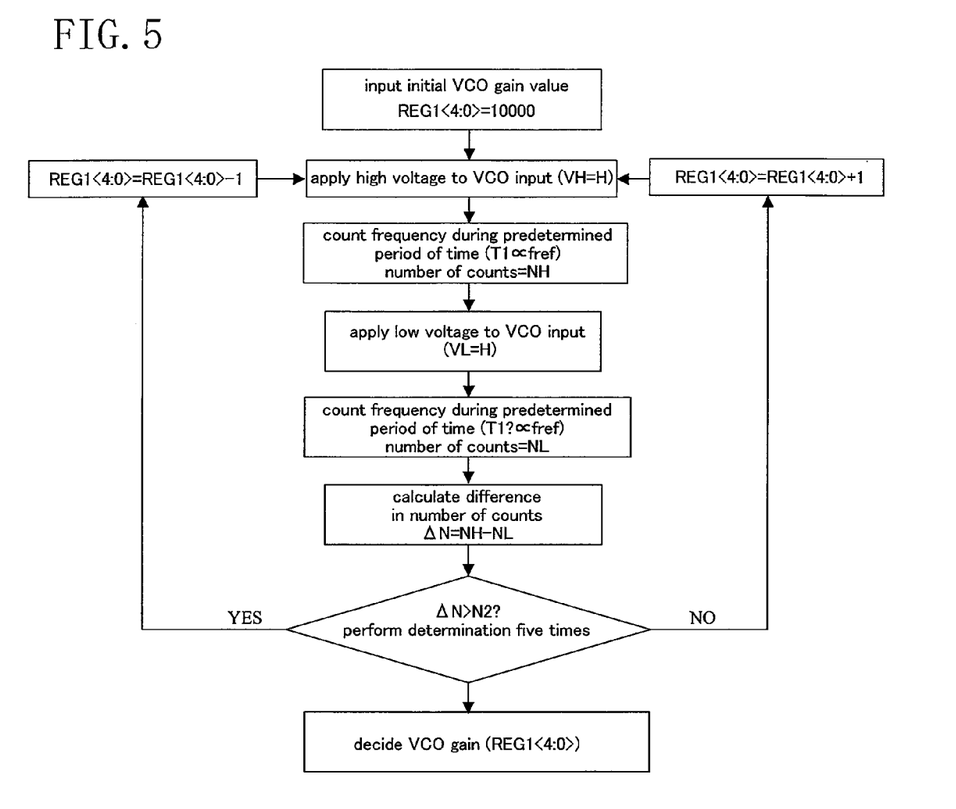
FIG. 5 is a flowchart of determination of the gain of the VCO by binary search.

The value of the control signal REG1 is efficiently determined by binary search based on 1-bit information indicating whether or not the output of the subtractor 1915 is larger than a target value, which is output from the comparator 1916. FIG. 5 shows a flow of determining the gain of the VCO 14 by binary search. Initially, the MSB of the control signal REG1 is set to "1" and the other bits are set to "0." Thereafter, the H voltage is input to the VCO 14 (the control signal VH=H), and the number of pulses of the feedback clock signal FBCLK is counted during a predetermined period of time (T1 ∝ fref) which is measured by the timer circuit 1911 (the number of counts=NH). Thereafter, the L voltage is input to the VCO 14 (the control signal VL=H), and the number of pulses of the feedback clock signal FBCLK is counted during a predetermined period of time (T1 ∝ fref) which is measured by the timer circuit 1911 (the number of counts=NL). Thereafter, it is determined whether or not a difference ΔN between these count numbers is larger than the target value N2. When the difference ΔN is larger than the target value N2, the MSB of the control signal REG1 is set to "0", and the next most significant bit is set to "1." When the difference ΔN is smaller than the target value N2, the next most significant bit is set to "1" before returning to the step of inputting the H voltage to the VCO 14. By performing the aforementioned determination operation five times, an optimal value of the control signal REG1 is determined.

An adaptive change in the gain of the VCO 14 depending on the input frequency, which is achieved by the VCO 14 and the calibration circuit 19 having the aforementioned configurations, will be described. When the input frequency is fref1, the target value N2 input to the comparator 1916 is represented by:

$$N2 = K1 \times \Delta V \times T1 \quad (2)$$

where K1 indicates a gain of the VCO 14 which is obtained when the input frequency is fref1, ΔV indicates a potential difference between the H voltage and the L voltage, and T1 indicates a period of time which is measured by the timer circuit 1911. The time period T1 corresponds to N1-fold of the reciprocal of the input frequency fref1. The target value N2 is represented by:

$$N2 = K1 \times \Delta V \times N1/fref1 \quad (3)$$

Expression (3) is changed to:

$$K1 = (1/N1) \times (N2/\Delta V) \times fref1 \quad (4)$$

Here, ΔV is a fixed value, and therefore, by setting N1 and N2 to fixed values, the gain K1 can be caused to be proportional to the input frequency fref1.

On the other hand, also when the input frequency is fref2, then if N1 and N2 are set to fixed values, the gain K2 of the VCO 14 is represented by:

$$K2 = (1/N1) \times (N2/\Delta V) \times fref2 \quad (5)$$

Thus, the gain K2 can be caused to be proportional to the input frequency fref2. Moreover, from Expressions (4) and (5), the following is derived:

$$K2/K1 = fref2/fref1 \quad (6)$$

Thus, the gain ratio of the VCO 14 is represented by the input frequency ratio. Note that a relationship between the gain of the VCO 14 and the input frequency can be switched by changing at least one of N1, N2 and ΔV.

(Example Configuration of Charge Pump Circuit)

Figure 6:
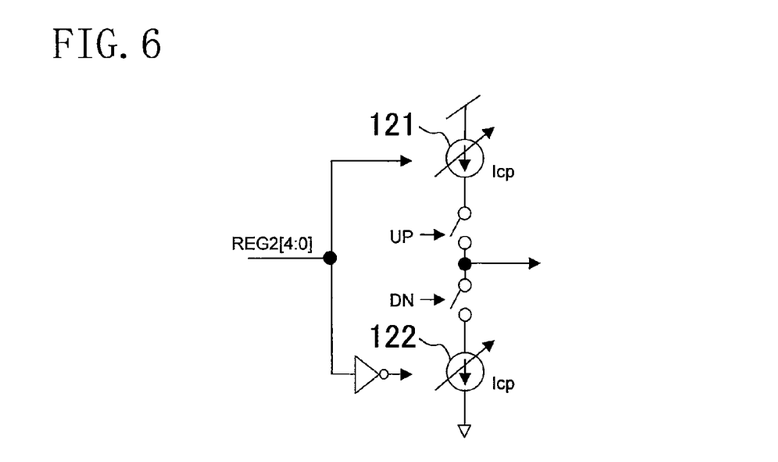
FIG. 6 is a diagram showing a configuration of a CP.
Figure 7:
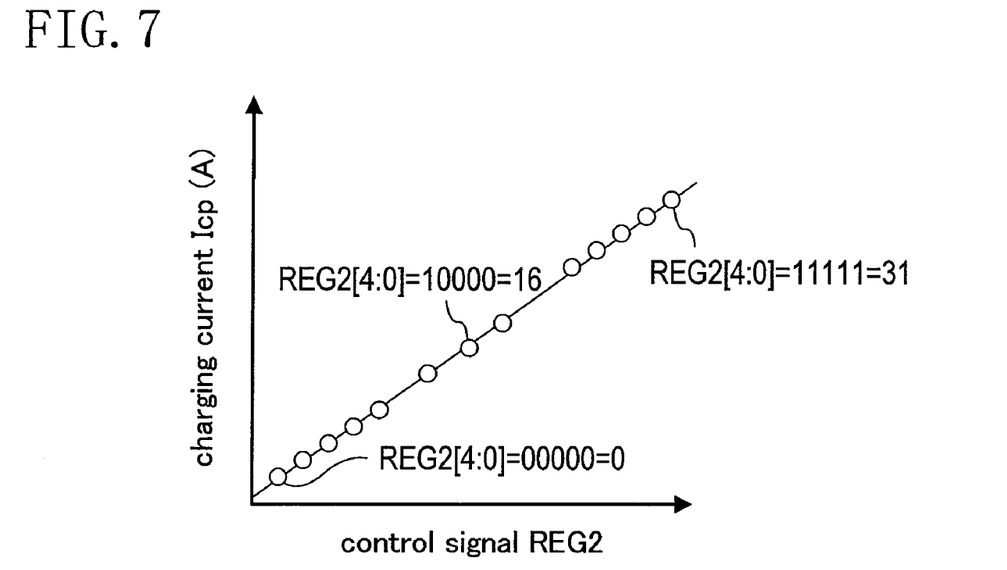
FIG. 7 is a graph showing changes in a charging current with respect to changed in a control signal.

FIG. 6 shows an example circuit configuration of the CP 12. Current sources 121 and 122 whose outputs are controlled in accordance with signals UP and DN output from the PFD 11, respectively, can each switch the charging current of the CP 12 between 32 (=$2^5$) levels in accordance with a 5-bit control signal REG2[4:0] output from the circuit portion 192 of the calibration circuit 19. FIG. 7 shows changes in the charging current of the CP 12 with respect to changes in the control signal REG2. As the value of the control signal REG2 is increased, the charging current increases. As the value of the control signal REG2 is decreased, the charging current decreases. Thus, the charging current of the CP 12 is substantially proportional to the value of the control signal REG2. Note that the charging current can be easily switched between multiple levels by, for example, using a plurality of current sources (a current ratio between each current source is a power of two), and switches which are connected to the respective current sources and in which switching control is performed in accordance with the respective bits of the control signal REG2.

Note that the number of bits of the control signal REG2 is other than five. As the number of bits is increased, the precision of the charging current setting of the CP 12 is improved.

(Example Configuration 2 of Calibration Circuit)

Figure 8:
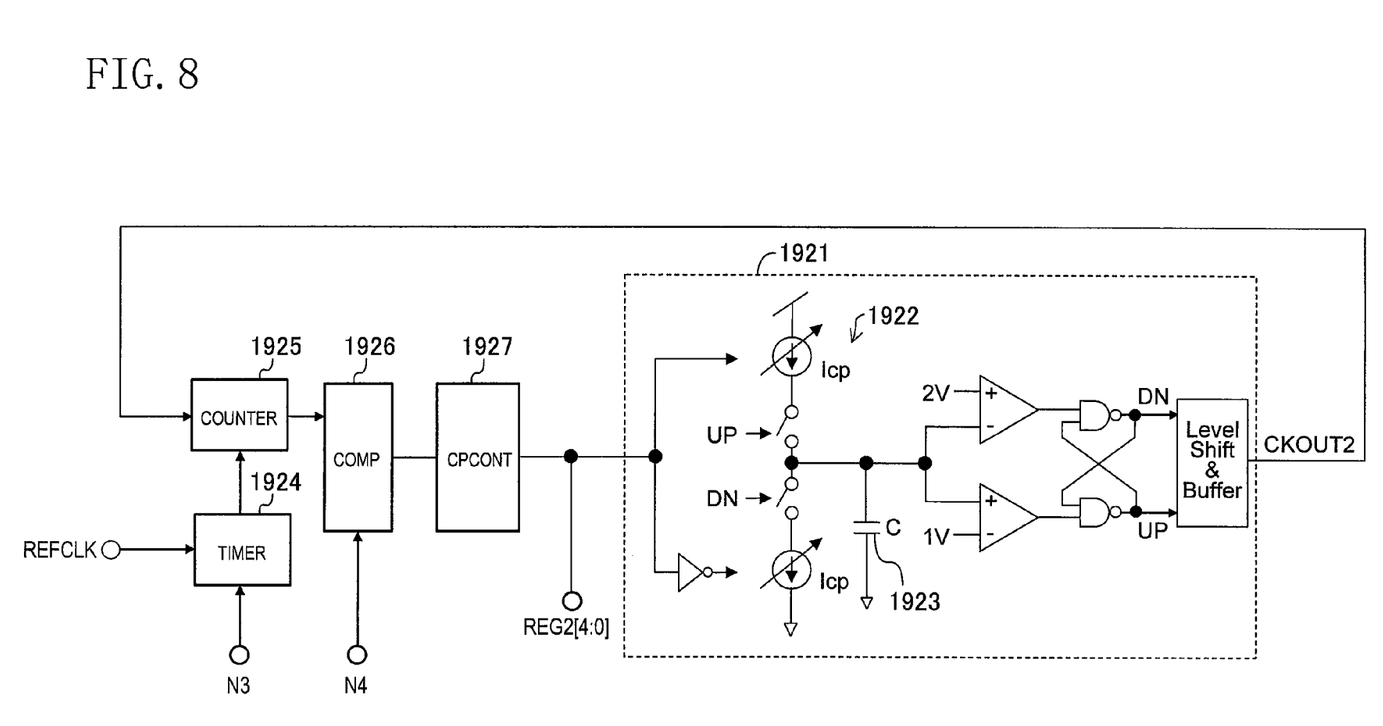
FIG. 8 is a diagram showing a configuration of a circuit portion of the calibration circuit which adjusts the charging current.

FIG. 8 shows an example configuration of the circuit portion 192 of the calibration circuit 19. An oscillator 1921 has a replica charge pump circuit (replica CP) 1922 which is a replica of the CP 12, and a filter capacitor 1923, and oscillates at a frequency (Icp/2C) depending on a charging current Icp of the replica CP 1922 and a capacitance value C of and the filter capacitor 1923. A timer circuit 1924 measures a period of time depending on the frequency of the reference clock signal REFCLK. Specifically, the timer circuit 1924 counts pulses of the reference clock signal REFCLK to a predetermined number N3. A counter circuit 1925 counts pulses of an output clock signal CKOUT2 of the oscillator 1921 during a period of time when the timer circuit 1924 is operating. A comparator 1926 compares a count value of the counter circuit 1925 with a target value N4. A control circuit 1927 outputs the control signal REG2 based on an output of the comparator 1926 to adjust the charging current of the replica CP 1922. The control circuit 1927 also sets the charging currents of the CP 12 and the replica CP 1922 in accordance with the common control signal REG2. In this case, it is not necessary to perform control to switch capacitance values with respect to the filter capacitor in the LPF 13.

Note that the replica CP 1922 may be configured in the same size as that of the CP 12, or may be configured in a smaller size. Similarly, the filter capacitor 1923 may be configured in the same size as that of the filter capacitor (not shown) in the LPF 13, or may be configured in a smaller size. In short, a ratio of the charging current of the replica CP 1922 to the capacitance value of the filter capacitor 1923 may be the same as a ratio of the charging current of the CP 12 to the capacitance value of the filter capacitor in the LPF 13. As a result, adjustment of the charging current of the CP 12 on which the loop bandwidth of the SSC-PLL 10 depends can be replaced with adjustment of the oscillation frequency of the oscillator 1921.

Moreover, instead of the reference clock signal REFCLK, a clock signal obtained by dividing the frequency of the reference clock signal REFCLK may be input to the timer circuit 1924. Similarly, instead of the clock signal CKOUT2, a clock signal obtained by dividing the frequency of the clock signal CKOUT2 may be input to the counter circuit 1925. The aforementioned configurations are only for illustrative purposes. Moreover, the control circuit 1927 may adjust the charging current of the replica CP 1922 so that the count value of the counter circuit 1925 approaches the target value N4.

Figure 9:
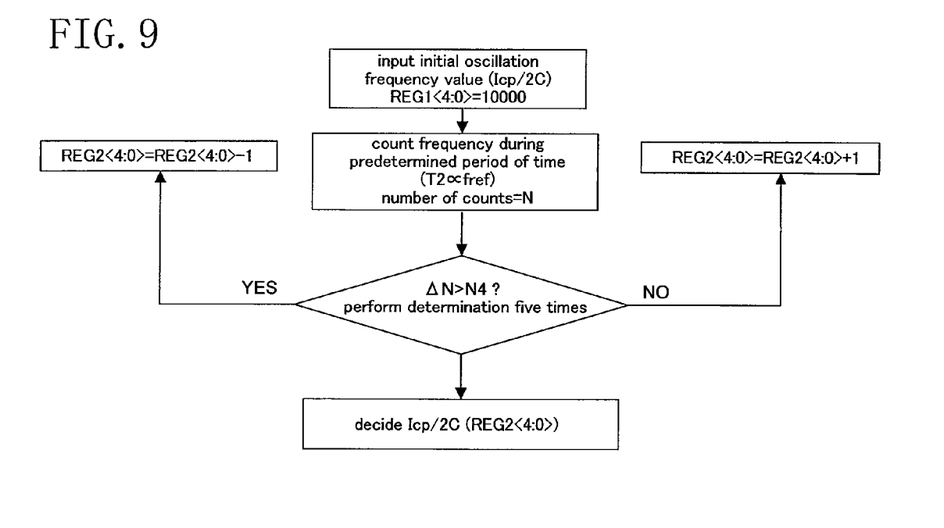
FIG. 9 is a flowchart of determination of an oscillation gain of an oscillator by binary search.

The value of the control signal REG2 is efficiently determined by binary search based on 1-bit information indicating whether or not the count value of the counter circuit 1925 is larger than a target value, which is output from the comparator 1926. FIG. 9 shows a flow of determining an oscillation gain of the oscillator 1921 by binary search. Initially, the MSB of the control signal REG2 is set to "1" and the other bits are set to "0." Thereafter, the number of pulses of the clock signal CKOUT2 is counted during a predetermined period of time (T2∝fref) which is measured by the timer circuit 1924 (the number of counts=N). Thereafter, it is determined whether or not the number of counts is larger than the target value N4. When the number of counts is larger than the target value N4, the MSB of the control signal REG2 is set to "0" and the next most significant bit is set to "1." When the number of counts is smaller than the target value N4, the next most significant bit is set to "1" before returning to the step of counting the number of pulses of the clock signal CKOUT2. By performing the aforementioned determination operation five times, an optimal value of the control signal REG2 is determined.

An adaptive change in the charging current of the CP 12 depending on the input frequency, which is achieved by the CP 12 and the calibration circuit 19 having the aforementioned configurations, will be described. When the input frequency is fref1, the target value N4 input to the comparator 1926 is represented by:

$$N4 = I1'/2C \times T2 \quad (7)$$

where I1' indicates a charging current of the replica CP 1922 which is obtained when the input frequency is fref1, C indicates a capacitance value of the filter capacitor 1923, and T2 indicates a period of time which is measured by the timer circuit 1924. If it is assumed that the charging current I1' of the replica CP 1922 is 1/n of the charging current I1 of the CP 12 (I1'=I1/n), and the time period T2 corresponds to N3-fold of the reciprocal of the input frequency fref1, the target value N4 is represented by:

$$N4 = (I1/n)/2C \times N3/fref1 \quad (8)$$

This expression is changed to:

$$I1 = n \times 2C \times N4/N3 \times fref1 \quad (9)$$

Here, since n and C are fixed values, if N3 and N4 are caused to be fixed values, the charging current I1 can be caused to be proportional to the input frequency fref1.

On the other hand, also when the input frequency is fref2, then if N3 and N4 are caused to be fixed values, the charging current I2 of the CP 12 is represented by:

$$I2 = n \times 2C \times N4/N3 \times fref2 \quad (10)$$

Therefore, the charging current I2 can be caused to be proportional to the input frequency fref2. From Expressions (9) and (10), the following is derived:

$$I1/I2 = fref2/fref1 \quad (11)$$

Thus, the charging current ratio of the CP 12 is represented by the input frequency ratio. Note that, by changing at least one of N3 and N4, a relationship between the charging current of the CP 12 and the input frequency can be switched.

(Example Configuration of Loop Filter Circuit)

Figure 10:
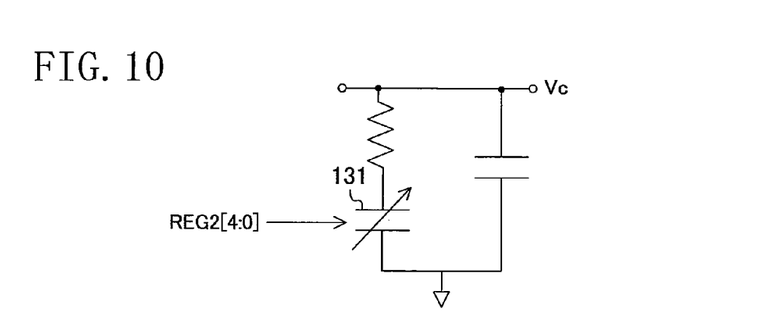
FIG. 10 is a diagram showing a configuration of an LPF.
Figure 11:
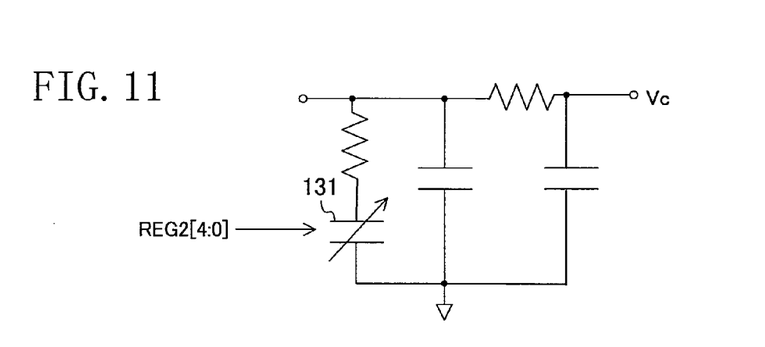
FIG. 11 is a diagram showing a configuration of an LPF.

FIG. 10 shows an example circuit configuration of the LPF 13 having a second-order RC configuration. FIG. 11 shows an example circuit configuration of the LPF 13 having a third-order RC configuration. The third-order RC configuration has a higher frequency cut-off characteristic than that of the second-order RC configuration, however, has a smaller phase margin, and therefore, is not suitable for an input frequency which varies over a wide range. In each of the configurations, the capacitance value of a filter capacitor 131 can be switched between 32 (=$2^5$) levels in accordance with the 5-bit control signal REG2[4:0] output from the circuit portion 192 of the calibration circuit 19. Note that the capacitance value of the filter capacitor 131 can be easily switched between multiple levels by, for example, using a plurality of capacitors (a capacitance ratio between each capacitor is a power of two), and switches which are connected to the respective capacitors and in which switching control is performed in accordance with the respective bits of the control signal REG2.

Note that the number of bits of the control signal REG2 is other than five. As the number of bits is increased, the precision of the capacitance value setting of the filter capacitor 131 is improved.

(Example Configuration 3 of Calibration Circuit)

Figure 12:
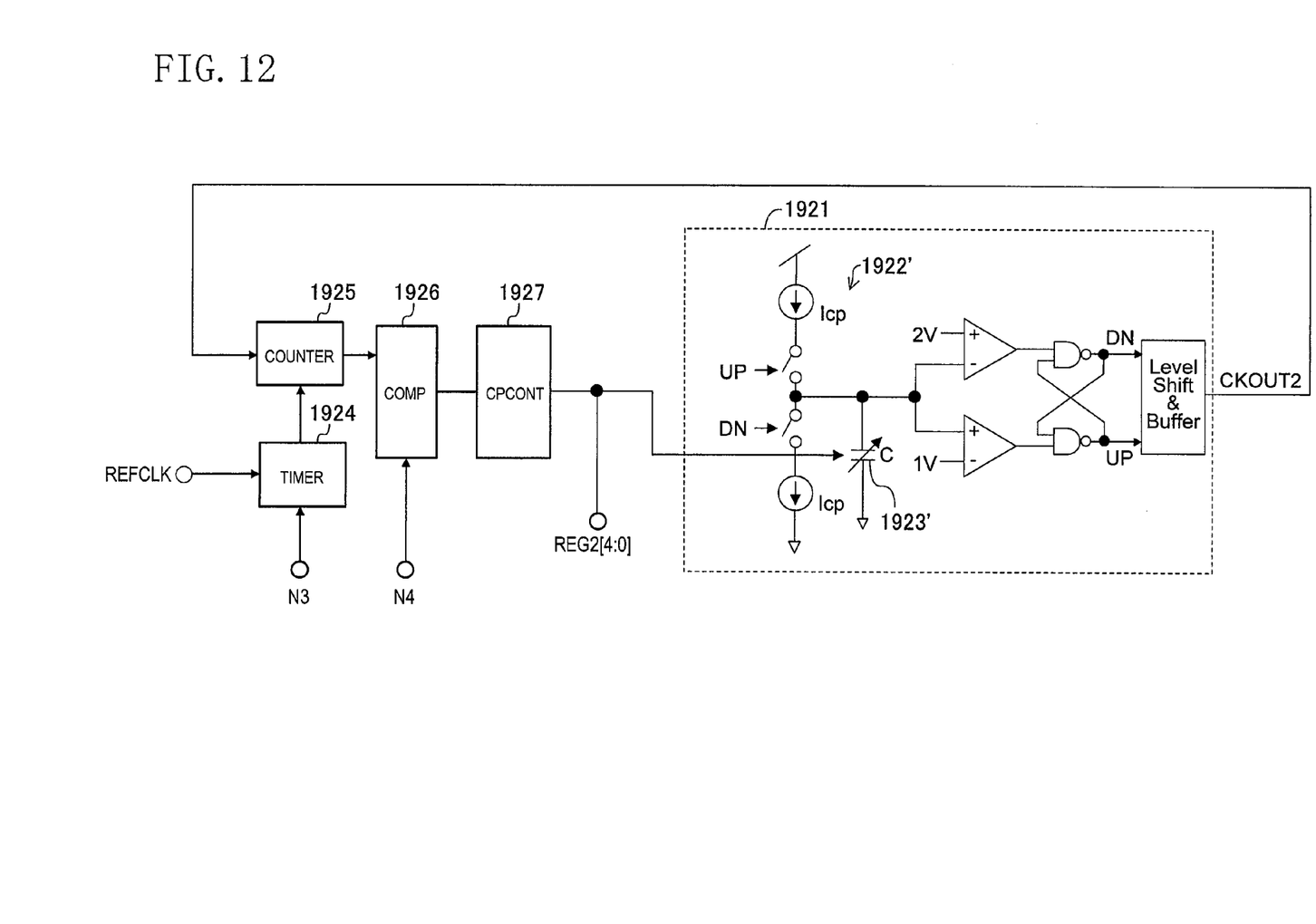
FIG. 12 is a diagram showing a configuration of a circuit portion of the calibration circuit which adjusts a filter capacitance value.

FIG. 12 shows an example configuration of the circuit portion 192 of the calibration circuit 19. Only a difference between the circuit portion 192 of the calibration circuit 19 and the configuration 2 of the aforementioned calibration circuit, will be described. The oscillator 1921 has a charge pump circuit (CP) 1922' and a replica filter capacitor (replica C) 1923' which is a replica of the filter capacitor 131, and oscillates at a frequency (Icp/2C) depending on a charging current Icp of the CP 1922' and a capacitance value C of the replica C 1923'. The control circuit 1927 outputs the control signal REG2 to adjust the capacitance value of the replica C 1923' based on the output of the comparator 1926. The control circuit 1927 also sets the capacitance values of the filter capacitor 131 and the replica C 1923' in accordance with the common control signal REG2. In this case, it is not necessary to perform control to switch the charging current with respect to the CP 12.

Note that the replica CP 1922' may be configured in the same size as that of the CP 12, or may be configured in a smaller size. Similarly, the replica C 1923' may be configured in the same size as that of the filter capacitor 131, or may be configured in a smaller size. In short, a ratio of the charging current of the CP 1922' to the capacitance value of the replica C 1923' may be the same as a ratio of the charging current of the CP 12 to the capacitance value of the filter capacitor 131. As a result, adjustment of the charging current of the filter capacitor 131 on which the loop bandwidth of the SSC-PLL 10 depends can be replaced with adjustment of the oscillation frequency of the oscillator 1921 instead thereof.

An adaptive change in the reciprocal of the capacitance value of the filter capacitor 131 depending on the input frequency, which is achieved by the LPF 13 and the calibration circuit 19 having the aforementioned configurations, will be described. When the input frequency is fref1, the target value N4 input to the comparator 1926 is represented by:

$$N4 = Icp/2C1' \times T2 \quad (12)$$

where Icp indicates a charging current of the CP 1922', C1' indicates a capacitance value of the replica C 1923' which is obtained when the input frequency is fref1, and T2 indicates a period of time which is measured by the timer circuit 1924. If it is assumed that the capacitance value C1' of the replica C 1923' is 1/n of the capacitance value C1 of the filter capacitor 131 (C1'=C1/n), and the time period T2 corresponds to N3-fold of the reciprocal of the frequency of the input frequency fref1, the target value N4 is represented by:

$$N4 = Icp/(2C1/n) \times N3/fref1 \quad (13)$$

This expression is changed to:

$$1/C1 = 2/n/Icp \times N4/N3 \times fref1 \quad (14)$$

Here, since n and Icp are fixed values, if N3 and N4 are caused to be fixed values, the reciprocal of the capacitance value C1 can be caused to be proportional to the input frequency fref1.

On the other hand, also when the input frequency is fref2, then if N3 and N4 are caused to be fixed values, the reciprocal of the capacitance value C2 of the filter capacitor 131 is represented by:

$$1/C2 = 2/n/Icp \times N4/N3 \times fref2 \quad (15)$$

Therefore, the reciprocal of the capacitance value C2 can be caused to be proportional to the input frequency fref2. From Expressions (14) and (15), the following is derived:

$$C2/C1 = fref2/fref1 \quad (16)$$

Thus, the reciprocal ratio of the capacitance value of the filter capacitance 131 is represented by the input frequency ratio. Note that, by changing at least one of N3 and N4, a relationship between the capacitance value of the filter capacitance 131 and the input frequency can be switched.

By the aforementioned calibration, even if there are variations in the charging current of the CP 12, the capacitance value of the filter capacitor in the LPF 13, and the gain of the VCO 14 in the SSC-PLL 10 due to variations in process, the values of the control signals REG1 and REG2 are set so that these values become the respective target values, by feedback. In other words, in the SSC-PLL 10, not only the loop bandwidth can be adaptively changed, depending on the input frequency, but also variations in process can be absorbed. For example, if the process is performed under a worst condition, the value of the control signal REG1 is set to be larger than that under a typical condition, and if the process is performed under a best condition, the value of the control signal REG1 is set to be smaller than that under the typical condition.

(Procedure of Starting Up SSC-PLL)

The SSC-PLL 10 is activated in a manner described as follows. Initially, the calibration circuit 19 is operated to adjust the gain of the VCO 14 (VCO calibration sequence) and one of the charging current of the CP 12 and the capacitance value of the filter capacitor in the LPF 13 (CP/LPF calibration sequence). Either of the two sequences may be executed first. Moreover, during a period of time when the VCO calibration sequence is being executed, the output of the LPF 13 is not input to the VCO 14, and therefore, the two sequences may be simultaneously executed.

When the two sequences are successively executed, a large portion of the calibration circuit 19 can be shared by the circuit portions 191 and 192, and therefore, the circuit area of the calibration circuit 19 can be reduced. On the other hand, when the two sequences are simultaneously executed, the circuit portions 191 and 192 need to be separately and independently provided, but calibration can be more quickly completed.

When the VCO calibration sequence and the CP/LPF calibration sequence are ended, a start-up sequence is then executed. In the start-up sequence, the signal STUP is activated in the start-up circuit 145 of FIG. 2 to pass an offset current to the VCO 14. As a result, the output of the VCO 14 is prevented from falling into a high impedance state, whereby the SSC-PLL 10 is locked (prelocked) at a predetermined frequency which is determined by the offset current. Although a typical SSC-PLL includes a lock detector which detects a locked state, the frequency pre-locked in the start-up sequence is desirably caused not to be detected by the lock detector. This is because, if the pre-locked state is detected, unnecessary data is likely to be output.

The passage of the offset current is stopped after a lapse of a predetermined period of time so as to reduce phase noise of the VCO 14. Thereafter, the SSC-PLL 10 transitions to a typical locked state while being in a state in which the spread spectrum control is not performed. Thereafter, when the lock detector detects the locked state, the spread spectrum control is caused to be effective. By this series of procedures, the SSC-PLL 10 can be stably activated without falling into a deadlock.

Note that the SSC-PLL 10 of this embodiment may be adapted to perform spread spectrum modulation with respect to the reference clock signal REFCLK (e.g., a PLL having a two-stage configuration or a receiver circuit in a high-speed interface) or the control voltage Vc of the VCO 14. Also, when the input frequency or the spread spectrum modulation frequency is fixed, the effect of absorbing variations in process is effective. Moreover, the calibration circuit 19 may output an analog control signal, and the CP 12, the LPF 13 and the VCO 14 may be controlled in accordance with the analog control signal.

Moreover, in the calibration circuit 19 of FIG. 1, one of the circuit portions 191 and 192 may be removed. Specifically, only one of Kvco (Kvco is the gain of the VCO 14) and Icp/C (Icp is the charging current of the CP 12 and C is the capacitance value of the filter capacitor in the LPF 13) may be changed in proportion to the input frequency. However, in this case, as can be seen from Expression (1), the loop bandwidth of the SSC-PLL 10 can be changed in proportion to as small as the input frequency to the power of ½. In other words, the magnitude of a change in the loop bandwidth is relatively small with respect to the magnitude of a change in the input frequency. Therefore, a circuit to be adjusted needs to be variable within a considerably wide range. However, it is likely to become difficult to achieve this as the power source voltage is decreased to a certain level. On the other hand, by changing both Kvco and Icp/C in proportion to the input frequency, the loop bandwidth of the SSC-PLL 10 can be changed in proportion to the input frequency. As a result, variable ranges of the gain of the VCO 14, the charging current of the CP 12, and the capacitance value of the filter capacitor in the LPF 13 can each be caused to become narrower.

(Embodiment 1 of Electronic Apparatus)

Figure 13:
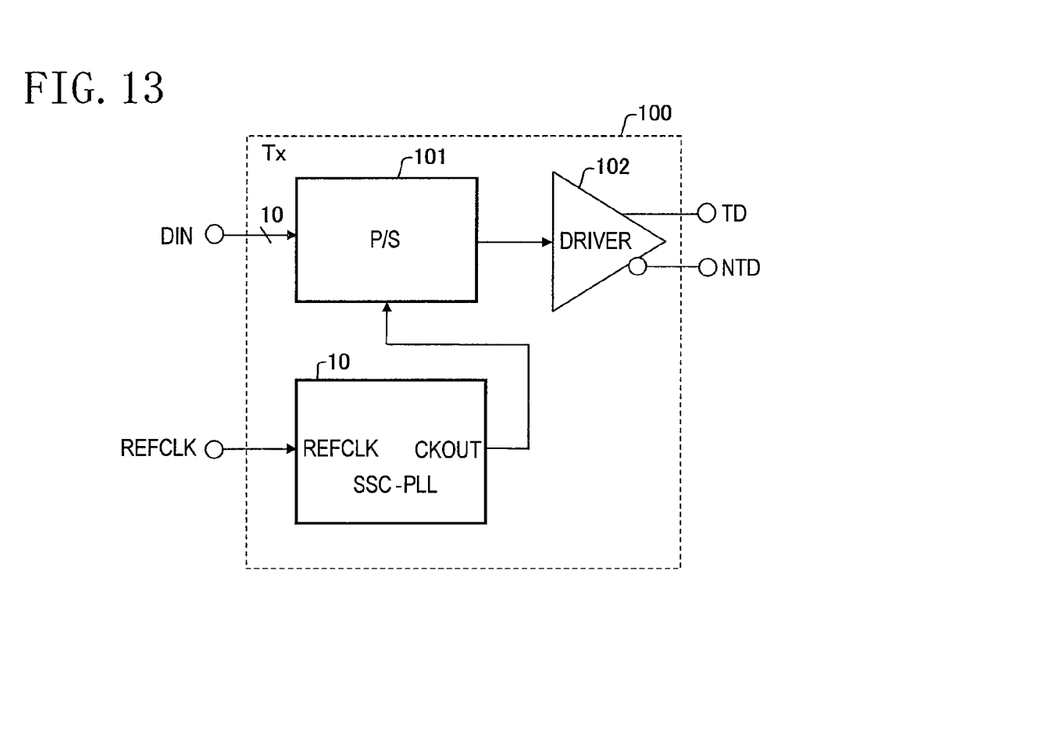
FIG. 13 is a diagram showing a configuration of an electronic apparatus according to an embodiment of the present invention.

FIG. 13 shows a configuration of an electronic apparatus (data transmitter) according to an embodiment of the present invention. The data transmitter (Tx) 100 includes the aforementioned SSC-PLL 10, a parallel-serial conversion circuit (P/S) 101, and a driver circuit 102. The P/S 101 receives a 125-Mbps 10-bit parallel signal from a digital block (not shown), and converts it into a 1250-Mbps serial signal. The driver circuit 102 transmits the serial signal (signals TD and NTD) via a cable to the receiver side of another chip. The SSC-PLL 10 generates the spread spectrum clock signal CKOUT from the reference clock signal REFCLK, and supplies it to the P/S 101. The SSC-PLL 10 can generate the clock signal CKOUT whose jitter and distortion are both suppressed even if the input frequency varies over a wide range (e.g., 125 MHz to 1250 MHz). As a result, the EMI of the Tx 100 can be reduced.

(Embodiment 2 of Electronic Apparatus)

Figure 14:
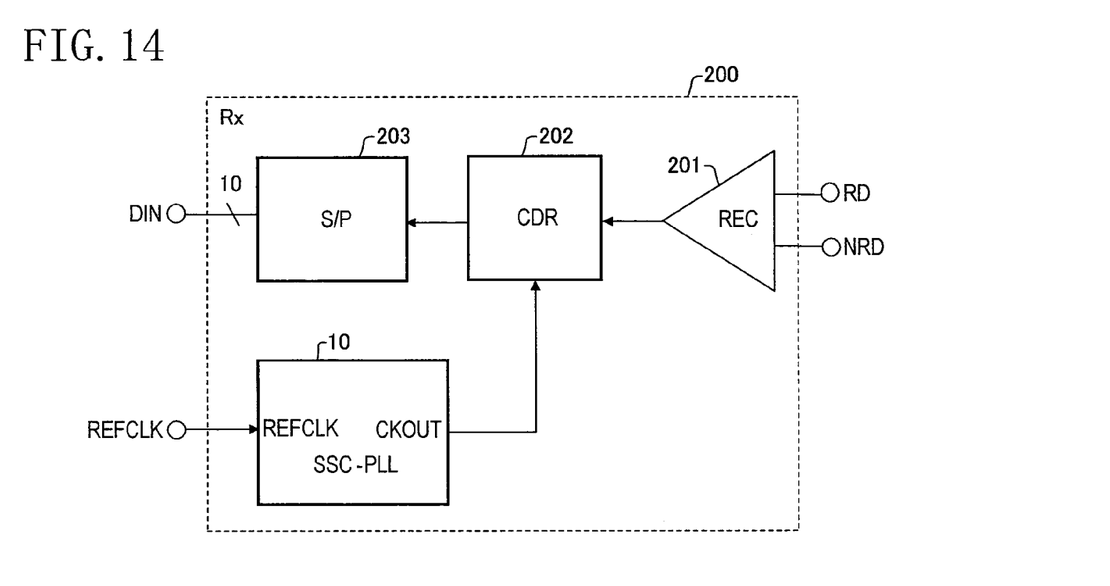
FIG. 14 is a diagram showing a configuration of an electronic apparatus according to an embodiment of the present invention.

FIG. 14 shows a configuration of an electronic apparatus (data receiver) according to an embodiment of the present invention. The data receiver (Rx) 200 includes the aforementioned SSC-PLL 10, a receiver circuit 201, a clock data recovery circuit (CDR) 202, and a serial-parallel conversion circuit (S/P) 203. The receiver circuit 201 receives and amplifies 125-Mbps serial signals RD and NRD which are transmitted via a cable from another chip. The CDR 202 reproduces a clock signal and data from the serial signal input from the receiver circuit 201, using the clock signal CKOUT supplied from the SSC-PLL 10 as a reference. The S/P 203 converts the 1250-Mbps serial signal input from the CDR 202 into a 125-Mbps 10-bit parallel signal, and transmits the 125-Mbps 10-bit parallel signal to a digital block (not shown). The SSC-PLL 10 generates the spread spectrum clock signal CKOUT from the reference clock signal REFCLK. The SSC-PLL 10 can generate the clock signal CKOUT whose jitter and distortion are both suppressed even if the input frequency varies over a wide range (e.g., 125 MHz to 1250 MHz). As a result, the EMI of the Rx 200 can be reduced.

INDUSTRIAL APPLICABILITY

The SSC-PLL of the present invention can generate a clock signal whose jitter and distortion are both suppressed even if an input frequency varies over a wide range, and therefore, is useful for a data transmission/reception system, a radio communication system or the like which requires low EMI.

The invention claimed is:

1. A spread spectrum control PLL circuit for outputting a spread spectrum clock signal based on an input reference clock signal, comprising:
   a charge pump circuit configured to switch charging and discharging of a charging current, depending on a phase difference between a feedback clock signal based on an output clock signal of the PLL circuit and the reference clock signal;
   a loop filter circuit having a filter capacitor which is charged and discharged using the charging current output from the charge pump circuit;
   a voltage controlled oscillator configured to oscillate at a frequency depending on an input control voltage; and
   a calibration circuit configured to adjust at least one of one of the charging current of the charge pump circuit and a capacitance value of the filter capacitor and a gain of the voltage controlled oscillator, depending on a frequency of the reference clock signal,
   wherein the voltage controlled oscillator includes:
      a selector circuit configured to select as the control voltage one from a first voltage, a second voltage, and an output voltage of the loop filter circuit, and
   the calibration circuit includes
      a timer circuit configured to measure a period of time depending on the frequency of the reference clock signal;
      a counter circuit configured to count pulses of the output clock signal of the PLL circuit or a frequency-divided clock signal thereof during a period of time when the timer circuit is operating; and
      a control circuit configured to control the selector circuit to adjust the gain of the voltage controlled oscillator so that a difference in count value of the counter circuit between when the first voltage is input to the voltage controlled oscillator and when the second voltage is input to the voltage controlled oscillator approaches a target value, and
   wherein
   the calibration circuit includes:
      a first memory circuit and a second memory circuit configured to store the count value of the counter circuit which is obtained when the first voltage is input to the voltage controlled oscillator and when the second voltage is input to the voltage controlled oscillator, respectively;
      a subtractor configured to calculate a difference between the count values stored in the first and second memory circuits; and
      a comparator configured to compare an output of the subtractor with the target value, and
   the control circuit adjusts the gain of the voltage controlled oscillator based on an output of the comparator.

2. The spread spectrum control PLL circuit of claim 1, wherein
   the calibration circuit outputs a digital control signal to switch the gain of the voltage controlled oscillator,
   the comparator outputs, as a result of the comparison, 1-bit information indicating whether or not the output of the subtractor is larger than the target value, and
   the control circuit determines a value of the digital control signal by binary search based on the result of the comparison by the comparator.

3. A spread spectrum control PLL circuit for outputting a spread spectrum clock signal based on an input reference clock signal, comprising:

a charge pump circuit configured to switch charging and discharging of a charging current, depending on a phase difference between a feedback clock signal based on an output clock signal of the PLL circuit and the reference clock signal;

a loop filter circuit having a filter capacitor which is charged and discharged using the charging current output from the charge pump circuit;

a voltage controlled oscillator configured to oscillate at a frequency depending on an input control voltage; and a calibration circuit configured to adjust at least one of one of the charging current of the charge pump circuit and a capacitance value of the filter capacitor and a gain of the voltage controlled oscillator, depending on a frequency of the reference clock signal, wherein the voltage controlled oscillator includes:
- a selector circuit configured to select as the control voltage one from a first voltage, a second voltage, and an output voltage of the loop filter circuit, and the calibration circuit includes:
- a timer circuit configured to measure a period of time depending on the frequency of the reference clock signal;
- a counter circuit configured to count pulses of the output clock signal of the PLL circuit or a frequency-divided clock signal thereof during a period of time when the timer circuit is operating; and
- a control circuit configured to control the selector circuit to adjust the gain of the voltage controlled oscillator so that a difference in count value of the counter circuit between when the first voltage is input to the voltage controlled oscillator and when the second voltage is input to the voltage controlled oscillator approaches a target value, and wherein the timer circuit counts pulses of the reference clock signal or a frequency-divided clock signal thereof to a predetermined number.

4. The spread spectrum control PLL circuit of claim 3, wherein at least one of the predetermined number, the first voltage, the second voltage and the target value is variable.

5. A spread spectrum control PLL circuit for outputting a spread spectrum clock signal based on an input reference clock signal, comprising:

a charge pump circuit configured to switch charging and discharging of a charging current, depending on a phase difference between a feedback clock signal based on an output clock signal of the PLL circuit and the reference clock signal;

a loop filter circuit having a filter capacitor which is charged and discharged using the charging current output from the charge pump circuit;

a voltage controlled oscillator configured to oscillate at a frequency depending on an input control voltage; and a calibration circuit configured to adjust at least one of one of the charging current of the charge pump circuit and a capacitance value of the filter capacitor and a gain of the voltage controlled oscillator, depending on a frequency of the reference clock signal, wherein the calibration circuit includes:
- an oscillator configured to have a replica charge pump circuit which is a replica of the charge pump circuit and a second filter capacitor which is charged and discharged using a charging current output from the replica charge pump circuit, and oscillate at a frequency depending on the charging current of the replica charge pump circuit and a capacitance value of the second filter capacitor;
- a timer circuit configured to measure a period of time depending on the frequency of the reference clock signal;
- a counter circuit configured to count pulses of an output clock signal of the oscillator or a frequency-divided clock signal thereof during a period of time when the timer circuit is operating; and
- a control circuit configured to adjust the charging current of the replica charge pump circuit so that a count value of the counter circuit approaches a target value, and the control circuit uses a common control signal to set the charging current for each of the charge pump circuit and the replica charge pump circuit.

6. The spread spectrum control PLL circuit of claim 5, wherein the calibration circuit includes:
- a comparator configured to compare the count value of the counter circuit with the target value, and the control circuit adjusts the charging current of the replica charge pump circuit based on an output of the comparator.

7. The spread spectrum control PLL circuit of claim 6, wherein the calibration circuit outputs a digital control signal to switch the charging current, the comparator outputs, as a result of the comparison, 1-bit information indicating whether or not the count value of the counter circuit is larger than the target value, and the control circuit determines a value of the digital control signal by binary search based on the result of the comparison by the comparator.

8. The spread spectrum control PLL circuit of claim 5, wherein the timer circuit counts pulses of the reference clock signal or a frequency-divided clock signal thereof.

9. The spread spectrum control PLL circuit of claim 8, wherein at least one of the predetermined number and the target value is variable.

10. A spread spectrum control PLL circuit for outputting a spread spectrum clock signal based on an input reference clock signal, comprising:

a charge pump circuit configured to switch charging and discharging of a charging current, depending on a phase difference between a feedback clock signal based on an output clock signal of the PLL circuit and the reference clock signal;

a loop filter circuit having a filter capacitor which is charged and discharged using the charging current output from the charge pump circuit;

a voltage controlled oscillator configured to oscillate at a frequency depending on an input control voltage; and a calibration circuit configured to adjust at least one of one of the charging current of the charge pump circuit and a capacitance value of the filter capacitor and a gain of the voltage controlled oscillator, depending on a frequency of the reference clock signal, wherein the calibration circuit includes:
- an oscillator configured to have a second charge pump circuit, and a replica filter capacitor which is a replica of the filter capacitor and is charged and discharged using a charging current output from the second charge pump circuit, and oscillate at a frequency depending on the charging current of the second charge pump circuit and a capacitance value of the replica filter capacitor;

a timer circuit configured to measure a period of time depending on the frequency of the reference clock signal;

a counter circuit configured to count pulses of an output clock signal of the oscillator or a frequency-divided clock signal thereof during a period of time when the timer circuit is operating; and a control circuit configured to adjust the capacitance value of the replica filter capacitor so that a count value of the counter circuit approaches a target value, and the control circuit uses a common control signal to set the capacitance values of the filter capacitor and the replica filter capacitor.

11. The spread spectrum control PLL circuit of claim 10, wherein the calibration circuit includes:

a comparator configured to compare the count value of the counter circuit with the target value, and the control circuit adjusts the capacitance value of the replica filter capacitor based on an output of the comparator.

12. The spread spectrum control PLL circuit of claim 11, wherein the calibration circuit outputs a digital control signal to switch the capacitance value of the filter capacitor, the comparator outputs, as a result of the comparison, 1-bit information indicating whether or not the count value of the counter circuit is larger than the target value, and the control circuit determines a value of the digital control signal by binary search based on the result of the comparison by the comparator.

13. The spread spectrum control PLL circuit of claim 10, wherein the timer circuit counts pulses of the reference clock signal or a frequency-divided clock signal thereof to a predetermined number.

14. The spread spectrum control PLL circuit of claim 13, wherein at least one of the predetermined number and the target value is variable.

* * * * *